United States Patent
Kasai et al.

(10) Patent No.: US 8,669,526 B2
(45) Date of Patent: Mar. 11, 2014

(54) SCINTILLATOR PANEL, RADIATION DETECTOR, AND METHOD FOR MANUFACTURING THE SAME

(75) Inventors: Shigetami Kasai, Tokyo (JP); Hiroshi Isa, Tokyo (JP); Makoto Iijima, Kanagawa (JP); Yasushi Nagata, Tokyo (JP)

(73) Assignee: Konica Minolta Medical & Graphic, Inc., Tokyo (JP)

( * ) Notice: Subject to any disclaimer, the term of this patent is extended or adjusted under 35 U.S.C. 154(b) by 0 days.

(21) Appl. No.: 13/124,784

(22) PCT Filed: Oct. 13, 2009

(86) PCT No.: PCT/JP2009/067712
§ 371 (c)(1),
(2), (4) Date: Apr. 18, 2011

(87) PCT Pub. No.: WO2010/050358
PCT Pub. Date: May 6, 2010

(65) Prior Publication Data
US 2011/0204247 A1    Aug. 25, 2011

(30) Foreign Application Priority Data

Oct. 28, 2008  (JP) ................................. 2008-276622

(51) Int. Cl.
*G01T 1/20* (2006.01)
(52) U.S. Cl.
USPC ....................................... 250/361 R; 250/367
(58) Field of Classification Search
USPC ............................................. 250/361 R, 367
See application file for complete search history.

(56) References Cited

U.S. PATENT DOCUMENTS

| | | | | |
|---|---|---|---|---|
| 4,437,011 | A | * | 3/1984 | Noji et al. ................... 250/486.1 |
| 7,538,330 | B2 | * | 5/2009 | Nomura et al. .......... 250/370.11 |
| 7,759,645 | B1 | * | 7/2010 | Brecher et al. ............. 250/361 R |
| 8,049,177 | B2 | * | 11/2011 | Sato et al. ..................... 250/367 |

(Continued)

FOREIGN PATENT DOCUMENTS

| | | |
|---|---|---|
| JP | 54-35060 | 10/1979 |
| JP | 63-215987 | 8/1988 |

(Continued)

OTHER PUBLICATIONS

Schotanus et al., Scintillation characteristics of pure and Tl-doped CsI crystals, 1990, IEEE Transactions on Nuclear Science, vol. 37, pp. 177-182.*

(Continued)

*Primary Examiner* — Christine Sung
(74) *Attorney, Agent, or Firm* — Lucas & Mercanti, LLP (57) ABSTRACT

Provided are a scintillator panel and a radiation detector which give a radiation image reduced in sensitivity unevenness and sharpness unevenness. Also provided are processes for producing the scintillator and the detector. The scintillator panel comprises a support and, deposited thereon, a phosphor layer comprising columnar crystals of a phosphor which have been formed by the vapor deposition method. The panel is characterized in that the columnar crystals of a phosphor comprise cesium iodide (CsI) as a base ingredient and thallium (Tl) as an activator ingredient and have, in a root part thereof, a layer containing no thallium, and that the coefficient of variation in thallium concentration in the plane of the phosphor layer is 40% or less.

7 Claims, 2 Drawing Sheets

(56) References Cited

U.S. PATENT DOCUMENTS

| | | |
|---|---|---|
| 2003/0047697 A1 | 3/2003 | Iwabuchi et al. |
| 2007/0051896 A1* | 3/2007 | Okada et al. ............. 250/370.11 |
| 2008/0217550 A1 | 9/2008 | Shoji |
| 2010/0117006 A1 | 5/2010 | Sawamoto |
| 2011/0036985 A1* | 2/2011 | Inoue ............................ 250/366 |
| 2012/0049075 A1* | 3/2012 | Nariyuki ....................... 250/368 |

FOREIGN PATENT DOCUMENTS

| | | |
|---|---|---|
| JP | 2003-050298 | 2/2003 |
| JP | 2008-216041 | 9/2008 |
| JP | 2008-224357 | 9/2008 |
| WO | WO 2008126757 A1 * | 10/2008 |
| WO | 2008/126757 | 5/2010 |

OTHER PUBLICATIONS

Supplemental European Search Report EP 09 82 3471.
Japanese Notification of Reasons for Refusal, Patent Application No. JP2010-535748, drafting date: Oct. 10, 2013) and English translation (5 pages).

* cited by examiner

SCINTILLATOR PANEL, RADIATION DETECTOR, AND METHOD FOR MANUFACTURING THE SAME

This is a 371 of PCT/JP2009/067712 filed Oct. 13, 2009 which in turn claimed the priority of Japanese Patent Application No. 2008-276622 filed Oct. 28, 2008, both applications are incorporated by reference herein.

TECHNICAL FIELD

The present invention relates to a scintillator panel and a radiation detector which gives a radiation image improved in an unevenness of emission property and an unevenness of sharpness and a method for manufacturing the same.

BACKGROUND

Heretofore, radiation images such as X-ray images have widely been employed in hospitals and clinics for the state of a disease. Specifically, over a long period of history, radiation images formed via intensifying screen-film systems have resulted in high photographic speed and high image quality, whereby even now, they are employed in hospitals and clinics in the world as imaging systems which simultaneously exhibit high reliability and cost performance.

However, types of the above image information are those of so-called analogue image information, and enable to achieve neither free image processing nor instantaneous electric transmission, which is realized in digital image information which has been developed in recent years.

Further, in recent years, digital system radiation image detection device, represented by computed radiography (CR) and flat-panel type radiation detectors (FPD) have appeared. These enable direct formation of digital radiation images and direct display images on image display devices such as a cathode tube or a liquid crystal panel can be achieved. When applying these radiographies, images are not always required to be formed on photographic film. As a result, the above digital system X-ray image detectors have decreased the need of image formation via silver halide photographic systems and have significantly enhanced convenience of diagnostic operation in hospitals and clinics.

As one of the digital technologies of X-ray images, computed radiography (CR) is presently employed in medical settings. However, sharpness is insufficient and spatial resolution is also insufficient, whereby its image quality level has not reached that of the screen-film systems. Further developed as a new digital X-ray image technology are flat-panel X-ray detectors (FPD) employing thin-film transistors (TFT), which are described, for example, on page 24 of John Rawland's report, "Amorphous Semiconductor Usher in Digital X-ray Imaging", Physics Today, November 1997 and on page 2 of L. E. Antonku's report, "Development of a High Resolution, Active Matrix, Flat-panel Imager with Enhanced Fill Factor" of the magazine of SPIE, Volume 32, 1997.

In order to convert radiation to visible light, employed are scintillator panels which are prepared employing X-ray phosphors exhibiting characteristics of emitting light via radiation. However, in order to enhance the SN ratio during imaging at low dosages, it becomes necessary to employ scintillator panel at a high light emitting efficiency. Generally, the light emitting efficiency of scintillator panels is determined by the thickness of the phosphor layer and the X-ray absorption coefficient, while as the thickness of the phosphor layer increases, scattering within the phosphor layer of emitted light occur, which lowers sharpness. Consequently, when required sharpness for image quality is determined, the layer thickness is determined.

Of the above phosphors, cesium iodide (CsI) exhibits a relatively high conversion ratio from X-rays to visible light and it is possible that phosphors are easily formed in a columnar crystal structure via vapor deposition. Consequently, scattering of emitted light in crystals is retarded via optical guide effects, whereby it has been possible to increase the thickness of the phosphor layer.

However, when only CsI is employed, the light emission efficiency is relatively low. Therefore, a mixture of CsI and sodium iodide (NaI) at any appropriate mol ratio is deposited on a substrate in the form of sodium-activated cesium iodide (CsI:Na), employing vapor deposition, and recently a mixture of CsI and thallium iodide (TlI) at any appropriate mol ratio is deposited on a substrate in the form of thallium-activated cesium iodide, employing vapor deposition. The resulting deposition is subjected to a thermal treatment at temperature of 200° C.-500° C. as a post-process to enhance the visible light conversion efficiency, whereby resulting materials are employed as an X-ray phosphor. (refer, for example, Patent Document 2)

However, as an activator has different crystal structure from cesium iodide, higher concentration of the activator deteriorates sharpness due to distortion of the columnar crystal structure. Thereby, when unevenness of the activator concentration increases, problems of unevenness occur not only in sensitivity but also in sharpness.

In Patent Document 3, in order to increase columnar crystallinity of phosphor layer, disclosed is a method for manufacturing of radiation image conversion panel in which a phosphor layer is formed comprising steps of forming a columnar crystal structure of base phosphor material by a vapor deposition method, then building up a columnar crystal structure of the phosphor on the columnar crystal structure (growing a columnar crystal of the phosphor on the columnar crystal of base phosphor material in one-to-one correspondence). However, this invention substantially relates to a stimulable phosphor, the columnar crystal structure of base phosphor material fuses with a columnar crystal structure of the phosphor in places of the obtained phosphor layer, resulting in rather worse unevenness of sharpness.

PRIOR ART DOCUMENTS

Patent Documents

Patent Document 1: Unexamined Japanese Patent Application Publication (hereafter referred to as JP-A) No. 63-215987
Patent Document 2: Examined Japanese Patent Publication No. 54-35060
Patent Document 3: JP-A No. 2003-50298

SUMMARY OF THE INVENTION

Problems to be Solved by the Invention

The present invention was intended in view of the above-described problems and an object thereof is to provide a scintillator panel and a radiation detector which gives a radiation image improved in an unevenness of sensitivity and an unevenness of sharpness and a method for manufacturing the same.

Means to Solve the Problems

The above described object of this invention is attained as follow.

1. A scintillator panel comprising a support, and deposited thereon, a phosphor layer comprising a columnar phosphor crystal formed by a vapor deposition method, wherein the columnar phosphor crystal comprise cesium iodide (CsI) as a base ingredient and thallium (Tl) as an activator ingredient, and a layer containing no thallium in a root part of the columnar phosphor crystal, and a coefficient of variation in thallium concentration in a plane of the phosphor layer is 40% or less.

2. A method for manufacturing the scintillator panel of item 1, wherein the phosphor layer is formed by a vapor deposition method using a vapor deposition apparatus comprising an evaporation source and a rotation mechanism of a support in a vacuum vessel, and comprising steps of fixing the support to the rotation mechanism of a support, and vapor-depositing a phosphor material while rotating the support.

3. The method for manufacturing the scintillator panel of item 2, wherein the phosphor layer is formed by a vapor deposition method comprising a plurality of evaporation sources in the vacuum vessel, and comprising a step of vapor-depositing 2 or more kinds of the phosphor materials having different composition charged in the evaporation sources.

4. A radiation detector comprising the scintillator panel of item 1 and a light receiving element in which a plurality of light receiving pixels are arranged in a two-dimensional array.

5. A radiation detector comprising a photoelectric conversion element formed on a substrate and a phosphor layer containing a columnar phosphor crystal formed by a vapor deposition method on the photoelectric conversion element, wherein the columnar phosphor crystal comprise cesium iodide (CsI) as a base ingredient and thallium (Tl) as an activator ingredient, and a layer containing no thallium in a root part of the columnar phosphor crystal; and a coefficient of variation in thallium concentration in a plane of the phosphor layer is 40% or less.

6. A method for manufacturing the radiation detector of item 5, wherein the phosphor layer is formed by a vapor deposition method using a vapor deposition apparatus comprising an evaporation source and a rotation mechanism of a support in a vacuum vessel, and comprising steps of fixing the substrate to the rotation mechanism of a substrate, and vapor-depositing a phosphor material while rotating the substrate.

7. The method for manufacturing the radiation detector of item 6, wherein the phosphor layer is formed by a vapor deposition method comprising a plurality of evaporation sources in the vacuum vessel, and comprising a step of vapor-depositing 2 or more phosphor materials having different composition charged in the evaporation sources.

Effects of the Invention

According to the present invention, a scintillator panel and a radiation detector which gives a radiation image improved in an unevenness of emission property and an unevenness of sharpness and a method for manufacturing the same can be provided.

DESCRIPTION OF THE PREFERRED EMBODIMENTS

The scintillator panel of the present invention is characterized in comprising a support deposited thereon, a fluorescent-substance layer comprising columnar crystals of a fluorescent substance which have been formed by the vapor deposition method, wherein the columnar crystals of a fluorescent substance comprise cesium iodide (CsI) as a base ingredient and thallium (Tl) as an activator ingredient, and have, in a root part thereof; a layer containing no thallium, and the coefficient of variation in thallium concentration in the plane of the fluorescent-substance layer is 40% or lower.

The invention has a common technical characteristic in that the columnar phosphor crystal comprise cesium iodide (CsI) as a base ingredient and thallium (Tl) as an activator ingredient, and in a root part thereof, a layer containing no thallium; and a coefficient of variation in thallium concentration in a plane of the phosphor layer is 40% or lower.

As the method for manufacturing the scintillator panel of the present invention, preferred is the method for manufacturing the phosphor layer in which the phosphor layer is formed by a vapor deposition method using a vapor deposition apparatus comprising an evaporation source and a rotation mechanism of a support in a vacuum vessel, and comprising steps of fixing the support to the rotation mechanism of a support, and vapor-depositing a phosphor material while rotating the support. Further, preferred is the method in which the phosphor layer is formed by a vapor deposition method comprising a plurality of evaporation sources in the vacuum vessel, and comprising a step of vapor-depositing 2 or more phosphor materials having different composition charged in the evaporation sources.

The scintillator panel of the present invention can be preferably applied for the radiation detector which comprises the scintillator panel and a light receiving element in which a plurality of light receiving pixels are arranged in a two-dimensional array.

The present invention includes a following radiation detector which has the common technical characteristic to the above scintillator panel.

That is a radiation detector comprising a photoelectric conversion element formed on a substrate and a phosphor layer containing a columnar phosphor crystal formed by a vapor deposition method on the photoelectric conversion element, wherein the columnar phosphor crystal comprise cesium iodide (CsI) as a base ingredient and thallium (Tl) as an activator ingredient, and in a root part thereof; a layer containing no thallium; and a coefficient of variation in thallium concentration in a plane of the phosphor layer is 40% or lower. As a method for manufacturing the radiation detector, preferred is a method for manufacturing a phosphor layer in which the phosphor layer is formed by a vapor deposition method using a vapor deposition apparatus comprising an evaporation source and a rotation mechanism of a support in a vacuum vessel, and comprising steps of fixing the substrate to the rotation mechanism of a substrate, and vapor-depositing a phosphor material while rotating the substrate. Further, preferred is a method for manufacturing a phosphor layer in which the phosphor layer is formed by a vapor deposition method comprising a plurality of evaporation sources in the vacuum vessel, and comprising a step of vapor-depositing 2 or more phosphor materials having different composition charged in the evaporation sources.

The present invention and the constituent elements thereof and preferred embodiments of the present invention will now be detailed.

(Constitution of Scintillator Panel)

The scintillator panel of the present invention is characterizes in comprising a support deposited thereon, a fluorescent-substance layer comprising columnar crystals of a fluorescent substance which have been formed by the vapor deposition method, wherein the columnar crystals of a fluorescent substance comprise cesium iodide (CsI) as a base ingredient and thallium (Tl) as an activator ingredient. Further, in accordance with purpose, the scintillator panel preferably has a constitution comprising various kinds of functional layers other than the phosphor layer as described later.

The radiation detector of the present invention may be provided by bonding or adhering a photoelectric conversion panel with a scintillator panel, in which scintillator panel, the phosphor layer is formed by the vapor deposition method on the first support (substrate) via a functional layer such as a reflective layer, and in which photoelectric conversion panel, a photoelectric conversion element member (hereinafter also referred to as "flat light receiving element") is formed by pixels comprising photo sensors and TFT (Thin Film Transistor) or CCD (Charge Coupled Devices) arranged in a two-dimensional array on the second support (substrate). Or the radiation detector may be provided, after forming flat light receiving element on the support (substrate), by forming a phosphor layer by the vapor deposition method, directly or via a functional layer such as a reflection layer or a protective layer.

As a typical example, various constituted layers and constitutions, mainly in case of forming scintillator panel, will now be specifically described. However, in case of providing a radiation detector by forming a phosphor layer directly, after forming a flat light receiving element on the support (substrate), the constituted layers and constitutions are basically same as the typical example.

(Phosphor Layer: Scintillator Layer)

The phosphor layer (also referred to as "Scintillator layer") of the present invention is characterized in a phosphor layer comprising phosphor columnar crystal comprising cesium iodide (CsI) as a base ingredient and thallium (Tl) as an activator ingredient.

As the material for constituting the phosphor layer, various fluorescent materials may be used and cesium iodide (CsI) is preferable because cesium iodide has relatively high conversion ratio of from X-ray to visible light and the columnar crystal structure of the fluorescent material can be easily formed by the vapor deposition so that the scattering of the emitted light in the crystal can be avoided by the light guiding effect, whereby the thickness of the phosphor layer can be increased. Therefore, the present invention is characterized in using cesium iodide (CsI) as a main component.

However, since CsI alone results in lower light emission efficiency, various activators are incorporated. One example is listed in which CsI and sodium iodide (NaI) are mixed at any appropriate mol ratio, as described in Japanese Patent Publication No. 54-35060. Further, as disclosed, for example, in JP-A No. 2001-59899, vapor-deposited CsI is preferred which incorporates activators such as thallium (Tl), europium (Eu), indium (In), lithium (Li), potassium (K), rubidium (Rb), or sodium (Na).

In the present invention, particularly preferred is thallium (Tl) as activator.

In addition, in the present invention, it is preferable to employ, as raw materials, additives incorporating at least one type of thallium compounds and cesium iodide. Namely, thallium-activated cesium iodide (CsI: Tl) is preferred since it has a broad light emission wavelength of 400-750 nm.

Usable thallium compounds, as additives, which incorporate at least one thallium compound, according to the present invention, include various ones (namely compounds having an oxidation number of +I and +III).

In the present invention, preferred thallium compound is thallium iodide (TlI).

Further, the melting point of the thallium compounds according to the present invention is preferably in the range of 400-700° C. When the melting point exceeds 700° C., additives in the columnar crystals are not uniformly oriented, resulting in a decrease in light emission efficiency. Meanwhile, the melting point in the present invention refers to one at normal temperature and pressure.

In the phosphor layer of the present invention, it is desirable that the content of the aforesaid additives is optimally regulated depending on the targeted performance. The above content is preferably 0.001-50 mol % with respect to the content of cesium iodide, but is more preferably 0.1-10.0 mol %.

When the added amount is more than 0.001 mol % with respect to cesium iodide, the resulting luminance of emitted light results in being enhanced from that obtained by employing cesium alone, whereby it is preferable to realize the targeted luminance of emitted light. On the other hand, when it is less than 50 mol %, it is preferable to be possible to maintain properties and functions of cesium iodide.

Thickness of a phosphor layer (scintillator layer) is preferably 100-800 μm, more preferably 120-700 μm in view of balancing properties between luminance and sharpness.

Phosphor columnar crystals related to the present invention are necessary to be formed by the vapor deposition method. Vapor deposition method, sputtering method, CVD method, ion plating method, and other methods are applicable as vapor deposition method. In the present invention, vapor deposition method is particularly preferred.

The phosphor layer of the present invention preferably comprise cesium iodide (CsI) as a base ingredient and thallium (Tl) as an activator ingredient, and a coefficient of variation in thallium concentration in a plane of the phosphor layer is 40% or lower, more preferably 30% or lower, further preferably 20% or lower, especially preferably 10% or lower.

The method of evaluating a coefficient of variation in thallium concentration in a plane of the phosphor layer is as follows. Phosphor samples of 0.2 g are collected from any 30 positions of the obtained phosphor layer and analyzed by ICP measurement. Then, standard deviation is calculated for Tl concentration at 30 positions, and the coefficient of variation represented by Expression (2) below is calculated by dividing the relative standard deviation by the average concentration of activators at 30 positions.

Coefficient of variation=Standard deviation of Tl concentration at 30 positions/Average concentration of activators In the present invention, it is necessary that the columnar phosphor crystal comprises cesium iodide (CsI) as main component and the columnar phosphor crystal is formed by the additive containing cesium iodide and thallium (Tl) as raw materials.

Further, preferred is that the columnar phosphor crystal related to the present invention comprises the layer containing no thallium in a root part thereof. Basically, these crystals can be prepared as follows. For example, the phosphor crystal (CsI) is formed by depositing only CsI on the support to the predetermined thickness, then the columnar phosphor crystal (phosphor layer) is formed on the formed crystals by depositing (vacuum depositing) the additive containing cesium iodide and thallium (Tl) (for example, CsI: 0.003 Tl) to the predetermined thickness.

Herein, "in a root part" means a part which is initially formed in a process of forming columnar phosphor crystal by a vapor deposition method and a part of the crystal less than 50% length of the average columnar phosphor crystal length in the phosphor layer.

Further, "a layer containing no thallium" means a crystal portion in a columnar phosphor crystal in which substantially thallium is not contained. Namely, it may be constituted by only cesium iodide, and it may also contain activator such as thallium less than 0.1% by mass based on a mass of a root part, or other impurities or additives.

Herein, the "layer containing no thallium" may be formed at either portion in a part of the crystal less than 50% length of the average columnar phosphor crystal length (in depth direction) in the phosphor layer. Preferably it may be preferably formed at a part of the crystal 30% or less, more preferably 10% or less length of the average columnar phosphor crystal length.

(Reflective Layer)

According to the present invention, the reflective layer (also referred to as "metal reflection layer") is preferably employed on the polymer substrate so as to enhance light drawing efficiency by reflecting the light emitted from the phosphor (scintillator). It is preferable that the aforesaid reflective layer is formed employing materials incorporating any of the elements selected from the element group consisting of Al, Ag, Cr, Cu, Ni, Ti, Mg, Rh, Pt, and Au.

Specifically, it is preferable to employ a thin metal film composed of the above metals, such as Ag film, or Al film. Further, at least two layers of the above may be formed. The thickness of the reflective layer is preferably in the range of 0.005 through 0.3 µm, more preferably in the range of 0.01 through 0.2 µm for the purpose of enhancing the emitted light extraction efficiency.

The method for forming the reflective layer according to the present invention may be any conventional method. For example, listed is a sputtering treatment using above materials.

(Protective Layer for Metal Reflection Layer)

In the scintillator panel according to the present invention, it is possible to provide a protective layer on the metal reflection layer.

The protective layer for the metal reflection layer is preferably formed by coating and drying the resin dissolved in a solvent. The polymer having a glass transition point of 30 through 100° C. is preferably used from the viewpoint of bonding of the film between the evaporated crystal and substrate. To put it more specifically, the preferred polymers are exemplified by a polyurethane resin, vinyl chloride copolymer, vinyl chloride-vinyl acetate copolymer, vinyl chloride-vinylidene chloride copolymer, vinyl chloride-acrylonitrile copolymer, butadiene-acrylonitrile copolymer, poly amide resin, polyvinyl butyral, polyester resin, cellulose derivative (e.g., nitro cellulose), styrene butadiene copolymer, various forms of synthetic rubber resins, phenol resin, epoxy resin, urea resin, melamine resin, phenoxy resin, silicon resin, acryl based resin and urea formamide resin. The polyester resin is used preferably in particular.

The film thickness of the protective layer for the metal reflection layer is preferably 0.1 µm or more for excellent bondability, and preferably 3.0 µm or less for ensuring satisfactory smoothness on the protective layer surface. More preferably, the thickness of the protective layer for the metal reflection layer is in the range of 0.2 through 2.5 µm.

The examples of the solvent used to produce the protective layer for the metal reflection layer include lower alcohols such as methanol, ethanol, n-propanol and n-butanol; chlorine atom-containing hydrocarbons such as methylene chloride and ethylene chloride; ketones such as acetone, methyl ethyl ketone and methyl isobutyl ketone; aromatic compounds such as toluene, benzene, cyclohexane, cyclohexanone and xylene; esters of lower fatty acid and lower alcohol such as methyl acetate, ethyl acetate and butyl acetate; ethers such as dioxane, ethylene glycol monoethyl ester and ethylene glycol monomethyl ester; and the mixtures thereof.

(Sublayer)

A sublayer according to the present invention is required to be arranged between the support (substrate) and the phosphor layer, or between the reflective layer and the phosphor layer so as to improve the adhesion. Further, it is preferable that the aforesaid sublayer incorporates polymer binders (binders) and dispersing agents. In addition, the thickness of the sublayer is preferably 0.5-4 µm.

The components of the sublayer will now be described.

<Polymer Binders>

It is preferable that the sublayer according to the present invention is formed by coating polymer binders (hereinafter also referred to as "binders") which are dissolved or dispersed in solvents, followed by drying. It is preferable to specifically employ, as polymer binders, polyurethane, vinyl chloride copolymers, vinyl chloride-vinyl acetate copolymers, vinyl chloride-vinylidene chloride copolymers, vinyl chloride-acrylonitrile copolymers, butadiene-acrylonitrile copolymers, polyamide resins, polyvinyl butyral, polyester, cellulose derivatives (such as nitrocellulose), styrene-butadiene copolymers, various synthetic rubber based resins, phenol resins, epoxy resins, urea resins, melamine resins, phenoxy resins, silicone resins, acryl based resins, and urea formamide resins. Of these, it is preferable to employ polyurethane, polyester, vinyl chloride based copolymers, polyvinyl butyral, and nitrocellulose.

In view of close contact with the phosphor layer, specifically preferred as the polymer binders according to the present invention are polyurethane, polyester, vinyl chloride copolymers, polyvinyl butyral, and nitrocellulose. Further, in view of the adhesion between the vapor deposition crystals and the substrate, preferred are polymers which exhibit a glass transition temperature (Tg) of 30-100° C. In the above point of view, specifically preferred as the polymer binders are polyester resins.

As the solvent to be used for forming the protective layer, a lower alcohol such as methanol, ethanol, n-propanol and n-butanol; a chlorine atom-containing hydrocarbon such as methylene chloride and ethylene chloride; a ketone such as acetone, methyl ethyl ketone and methyl isobutyl ketone; an aromatic compound such as toluene, benzene, cyclohexane, cyclohexanone and xylene; an ester of lower fatty acid and lower alcohol such as methyl acetate, ethyl acetate and butyl acetate; an ether such as dioxane, ethylene glycol monoethyl ester and ethylene glycol monomethyl ester and a mixture of them are usable.

In order to minimize scattered light emitted by phosphors (scintillators) and to enhance sharpness, pigments and dyes may be incorporated into the sublayer according to the present invention.

(Protective Layer)

The protective layer according to the present invention is mainly aimed to protect the phosphor layer. Namely, cesium iodide (CsI) easily absorbs moisture. When it is exposed to an ambient atmosphere, it is subjected to deliquescence via absorption of moisture from the atmosphere. Consequently, the protective layer is provided to minimize the above deliquescence.

It is possible to form the aforesaid protective layer employing various materials. For example, as the protective layer, polyparaxylylene layer can be formed by CVD method on all surfaces of phosphor and support (substrate).

As other type of protective layer, a polymer film can be formed on the phosphor layer. As for the polymer film, a same polymer film as the material for the support (substrate) described later can be used.

In consideration of void formation, protection of the phosphor layer, sharpness, moisture resistance, and workability, the thickness of the above protective film is preferably 12-120 μm, but is more preferably 20-80 μm. Further, in consideration of sharpness, irregularity of radiographic images, production stability, and workability, the haze ratio is preferably 3-40%, but is more preferably 3-10%. "Haze ratio" refers to the value determined by NDH 5000W of Nippon Denshoku Industries Co., Ltd. Films at a desired haze ratio are readily available on market via suitable selection.

In the present invention, upon considering a photoelectric conversion ratio and the wavelengths of radiation emitted by phosphors (scintillators), the light transmission of the first protective film is preferably at least 70% at 550 nm. However, since it is industrially difficult to produce a film of a light transmission of at least 99%, in practice, the light transmission is preferably 99-70%.

In regard to protection of the phosphor layer and deliquescence, the moisture vapor transmittance of the protective film is preferably at most 50 g/m$^2$·day (at 40° C. and 90% relative humidity) (determined based on JIS Z 0208), but is more preferably 10 g/m$^2$ day (at 40° C. and 90% relative humidity) (determined based on JIS Z 0208). However, since it is industrially difficult to produce a high light transmission film of at most 0.01 g/m$^2$·day (at 40° C. and 90% relative humidity), in practice, the moisture vapor transmittance is preferably 0.01-50 g/m$^2$·day (at 40° C. and 90% relative humidity) (determined based on JIS Z 0208), but is more preferably 0.1-10 g/m$^2$·day (at 40° C. and 90% relative humidity) (determined based on JIS Z 0208).

(Support: Substrate)

As the support (also referred to as "substrate"), preferred are quartz glass sheet, metal sheet comprising such as aluminum, iron, tin or chromium, carbon fiber reinforced sheet and polymer film.

As polymer film, polymer film (plastic film) such as cellulose acetate film, polyester film, polyethylene naphthalate (PEN) film, polyamide film, polyimide (PI) film, triacetate film, polycarbonate film, carbon fiber reinforced resin sheet can be used. Specifically polymer film containing polyimede or polyethylene naphthalate is preferred when phosphor columnar crystal is formed from cesium iodide as raw material by using gas phase method.

Polymer film as a substrate according to the present invention preferably has a thickness of 50 through 500 μm and further preferably has flexibility.

"Flexible substrate" means the substrate having an elastic modulus at 120° C. (E120) of 1000-6000 N/mm$^2$. Polymer film containing polyimide or polyethylene naphthalate is preferably used as this substrate.

"Elastic modulus" is calculated from the slope of stress against strain in the rage which a stress has linear relation with a strain indicated by a marked line on a sample complying with JIS-C2318 by using tensile tester. This value is called as Young's modulus and in the present invention "Elastic modulus" is defined by this Young's modulus.

The support (substrate) of the present invention preferably has an elastic modulus at 120° C. (E120) of 1000-6000 N/mm$^2$, more preferably 1200 N/mm$^2$-5000 N/mm$^2$.

Specific example of polymer film include polyethylene naphthalate (E120-1100 N/mm$^2$), polyethylene terephthalate (E120=500 N/mm$^2$), polybutylene naphthalate (E120=1600 N/mm$^2$), polycarbonate (E120=1700 N/mm$^2$), syndiotactic polystyrene (E120=2200 N/mm$^2$), polyetherimide (E120=1900 N/mm$^2$), polyarylate (E120=1700 N/mm$^2$), polysulphone (E120=1800 N/mm$^2$), and polyethersulphone (E120=1700 N/mm$^2$).

These are utilized alone or in laminated or mixed state. Of these, as described above, polymer film containing polyimide or polyethylene naphthalate is preferably used.

Occasionally, during arrangement of the scintillator panel facing the surface of a flat light receiving element, uniform image quality characteristics are not obtained due to effects such as the deformation of the support (substrate) and curling during vapor deposition. In order to overcome the above drawbacks, a polymer film substrate of a thickness of 50-500 μm is employed as the aforesaid substrate so that the scintillator panel is deformed to the shape matching that of the surface of the flat light receiving element, whereby uniform sharpness is realized over the entire light receiving surface of the flat-panel detector.

Further, the support may have a resin layer so as to have smooth surface thereof. Resin layer preferably contains a compound such as polyimide, polyethylene phthalate, paraffin, or graphite. The thickness thereof is preferable about 5-50 μm. The resin layer may be provided on the surface of the support or backside thereof.

Means of providing adhesive layer on the support include lamination method and coating method. Of these, lamination method is carried out by using heat and pressure roller, preferably under a condition of heating at about 80-150° C., pressure of 4.90×10-2.94×10$^2$N/cm, and conveying speed of 0.1-2.0 m/s.

(Manufacturing Method of Scintillator Panel)

The method for manufacturing the scintillator panel according to the present invention is preferred in which phosphor layer is formed by a vapor deposition method using a vapor deposition apparatus comprising an evaporation source and a rotation mechanism of a support in a vacuum vessel, and comprising steps of fixing the support to the rotation mechanism of a support, and vapor-depositing a phosphor material while rotating the support.

Typical example of manufacturing method of the scintillator panel of the present invention is described below with reference to FIG. 1.

(Production Apparatus of Scintillator Panel)

Figure 1:
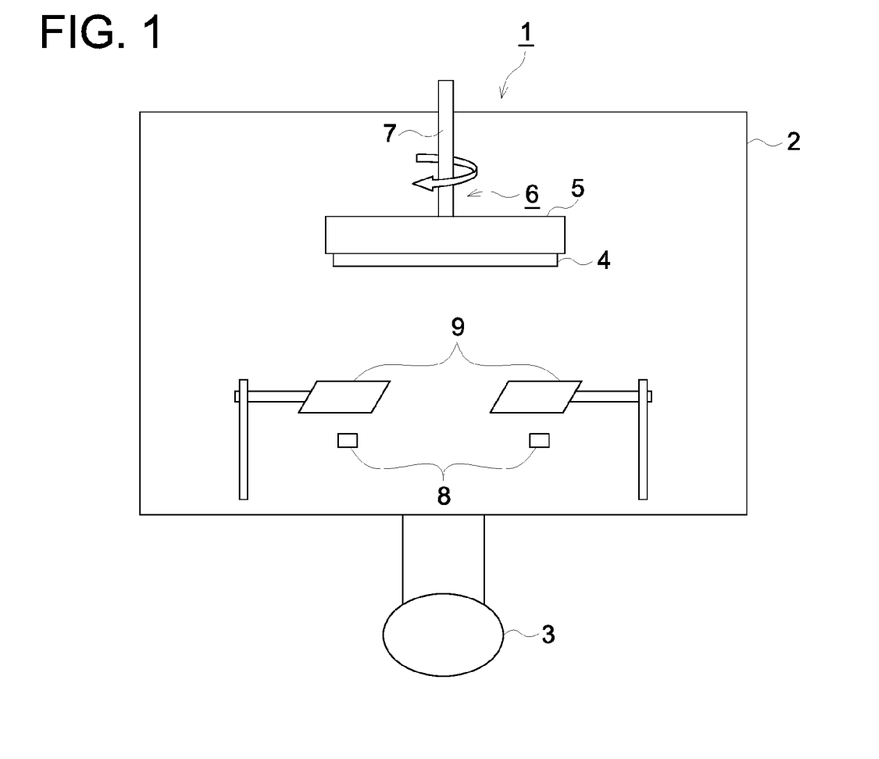
FIG. 1 is a schematic illustration of apparatus for manufacturing a scintillator panel.

FIG. 1 is a schematic view of a constitution of a production apparatus of the scintillator panel 1. As shown in FIG. 1, a vacuum vessel 2 is provided in production apparatus of the scintillator panel 1. A vacuum pump 3 is provided in the vacuum vessel 2 which discharges gas from vacuum vessel 2 and introduces air.

Vacuum vessel 2 incorporates support holder 5 which holds support 4 around a inner top surface.

Phosphor layer is formed on support 4 by the vapor deposition method. Vapor deposition method, sputtering method, CVD method, ion plating method, and other methods are applicable as vapor deposition method. In the present invention, vapor deposition method is particularly preferred.

Support holder 5 has a constitution to hold support 4 so as to arrange the surface of support 4 on which the phosphor layer is formed to face to and to parallel to bottom surface of vacuum vessel 2.

Further, it is preferable that support holder 5 is provided with a heater (not shown) which heats support 4. By heating support 4, it is possible to enhance close contact of support 4 to support holder 5 and to regulate the quality of the scintillator layer. Further, it is possible to release and remove substances adsorbed on the surface of support 4, thereby to prevent the generation of an impure layer between the surface of support 4 and the scintillator layer.

Further, in production apparatus of the scintillator panel 1, a circulating mechanism of warm heat medium or heat medium may be provided as a heating means. This means is suitably employed for vapor deposition of phosphor under keeping a temperature of a support 4 in relatively low temperature such as 50-150° C.

Halogen lump (not shown) may be employed as heating means. This means is suitably employed for vapor deposition of phosphor under keeping a temperature of a support 4 in relatively high temperature such as 150° C. or more.

Support rotation mechanism 6 is employed in support holder 5. Support rotation mechanism 6 is composed of rotation shaft 7 which holds support holder 5 and rotates support 4, and a motor (not shown) which is arranged in the outside of vacuum vessel 2 and functions as a driving source of rotation shaft 7.

At positions faced each other on circle which has a center with axis perpendicular to support 4 in the vicinity of bottom face, vaporization sources 8a and 8b are arranged. In this case, support 4 and evaporation sources 8 is preferably arranged to form a gap of 100-1,500 mm, more preferably 200-1000 mm. Further, axis perpendicular to support 4 and evaporation sources 8a and 8b are preferably arranged to form a gap of 100-1,500 mm, more preferably 200-1000 mm.

Incidentally, in preparation apparatus of the scintillator panel 1 according to the present invention, a plurality of evaporation sources not less than 3 may be employable. Each evaporation source may be arranged at equal spaces or at changing space. Further, radius of the circle having a center with axis perpendicular to support 4 may be arbitrarily determined.

Vaporization source 8a and 8b may be composed of an alumina crucible containing a coiled heater so that it accommodates scintillator forming materials and is heated by a resistance heating method, or may be composed of a boat or a heater prepared by employing metals of a high melting point. Other than the resistance heating method, employed as a method to heat the phosphor forming materials may be heating methods employing electron beams or high frequency induction. However, in the present invention, in view of ease of handling under relatively simple configuration, lower cost, and application compatibility to a number of substances, the resistance heating method is preferred. Further, vaporization sources 8a and 8b may be a molecular beam source employing a molecular source epitaxial method.

Further, a shutter 9 to block the space from evaporation source 8a and 8b to support 4 may be provided between support 4 and evaporation source 8a and 8b. By providing the above shutter 9, substances other than targeted ones, which are adhered to the surface of phosphor layer forming materials, are evaporated in the early stage of deposition, whereby it is possible to minimize their adhesion to support 4.

(Manufacturing Method of Scintillator Panel)

Subsequently, a manufacturing method of scintillator panel employing above production apparatus of scintillator panel 1 will now specifically be described.

Initially support 4 is attached to support holder 5. In the vicinity of bottom face, vaporization sources 8a and 8b are arranged at positions faced each other on circle which has a center with axis perpendicular to support 4. In this case, support 4 and evaporation sources 8a and 8b are preferably arranged to form a gap of 100-1,500 mm, more preferably 200-1000 mm. Further, axis perpendicular to support 4 and evaporation sources 8a and 8b are preferably arranged to form a gap of 100-1,500 mm, more preferably 200-1000 mm.

Subsequently, vacuum vessel 2 is evacuated to control to the targeted degree of vacuum. Thereafter, support holder 5 is rotated with respect to evaporation sources 8a and 8b, employing support rotation mechanism 6. When vacuum vessel 2 reaches the degree of vacuum which enables vapor deposition, phosphor layer forming materials are vaporized from heated evaporation sources 8a and 8b, and phosphors are grown on the surface of support 4 to the targeted thickness.

The phosphor layer may be fanned by dividing a phosphor growing process on support 4 into a plurality of steps.

Further, during vapor deposition, the deposited object (support 4, protective layer or intermediate layer) may be cooled or heated as appropriate.

Further, after finishing vapor deposition, the phosphor layer may be heat treated. In vapor deposition method, reaction vapor deposition in which gases such as $O_2$ and $H_2$ is introduced as appropriate.

Thickness of the formed phosphor layer is different according to an intended purpose of a radiation image conversion panel or the kind of phosphors. It is preferable 50-2000 μm, more preferable 50-1000 μm, and further preferable 100-800 μm.

Temperature of support 4 on which the phosphor layer is formed is preferably set at room temperature (rt)-300° C., and more preferably 50-250° C.

After forming the phosphor layer according to above, protective layer may be employed on the phosphor layer which locates on the opposite side of support 4 so as to protect physically or chemically the phosphor layer. The protective layer may be fanned by coating a coating solution for the protective layer directly on the surface of the phosphor layer, or a preliminarily and separately prepared protective layer may be adhered to the phosphor layer. Thickness of these protective layers is preferable 0.1-2000 μm.

Further, the protective layer may be formed by laminating an inorganic compound such as SiC, $SiO_2$, SiN or $Al_2O_3$ by vapor deposition method or sputtering method.

According to the present invention, above various functional layers other than the protective layer is preferably provided.

According to above preparation apparatus 1 or method for manufacturing of scintillator panel, vapor flow can be rectified at an overlapping portion of flows from the evaporation sources 8a and 8b by providing a plurality of evaporation sources 8a and 8b, resulting in uniform crystallinity of the phosphor deposited on the surface of the support 4.

In this case, as providing more evaporation sources, more vapor flow can be rectified and crystallinity of the phosphor can be equalized over wider range. Further, by arranging vaporization sources 8a and 8b at positions faced each other on circle which has a center with axis perpendicular to support 4, the uniform crystallinity by rectifying vapor flow can be obtained isotropically on the surface of the support 4.

Further, by vapor-depositing a phosphor material while rotating the support 4 via the rotation mechanism of the support 6, the phosphor can be vapor deposited uniformly on the surface of the support 4.

As described above, according to the preparation apparatus 1 or the method for manufacturing of scintillator panel of the present invention, the phosphor layer is grown so as to have uniform crystallinity on the surface of the support 4 and it can give a radiation image improved in an unevenness of sensitivity of the scintillator layer and an unevenness of sharpness of the radiation image conversion panel using scintillator panel.

Further, by preventing a variation of incident angle to the phosphor by restricting incident angle of the deposited phosphor within the predetermined range, crystallinity of the phosphor layer becomes more uniform and results in enhancing an unevenness of sharpness of the radiation image obtained by the radiation image conversion panel.

As described in the case of the support holder 5 having the rotation mechanism of the support 6, however the present invention is not limited thereto. The present invention can be employable in the case that vapor deposition is carried out while the support holder 5 holds support 4 in a resting state, or in the case that the support 4 is horizontally moved against the vaporization sources 8a and 8b, and the phosphor from the vaporization sources 8a and 8b is deposited.

(Radiation Detector)

The radiation detection device (also referred to as "radiation detector", "radiation image detector", "radiation flat panel detector") of the present invention may be provided by bonding or adhering a photoelectric conversion panel with a scintillator panel, in which scintillator panel, the phosphor layer is formed by the vapor deposition method on the first support (substrate) via a functional layer such as a reflective layer, and in which photoelectric conversion panel, a photoelectric conversion element member (flat light receiving element) is formed by pixels comprising photo sensors and TFT or CCD arranged in a two-dimensional array on the second support (substrate). Or the radiation detector may be provided, after forming flat light receiving element on the support (substrate), by forming a phosphor layer by the vapor deposition method, directly or via a functional layer such as a reflection layer or a protective layer.

The radiation detection apparatus of the present invention has to comprise the phosphor layer and the light receiving element (hereinafter referred to as "flat light receiving element") arranged pixels in a two-dimensional array. The flat-panel light receiving element according to the present invention enables conversion of images to digital data in such a manner that the surface of the flat light receiving element converts light, emitted from a phosphor layer, to electric charges.

Surface average roughness (Ra) of the flat-panel light receiving element of the present invention is preferable 0.001-0.5 µm. Therefore, in order to satisfy this condition, preferred is to control surface roughness by forming an organic resin layer such as polyester or acryl on the surface after forming light receiving element on a surface of glass, and treating by photo-etching method. Surface average roughness (Ra) of the flat-panel light receiving element of the present invention is preferable 0.001-0.1 µm, more preferable 0.001-0.05 µm.

The radiation image conversion panel of the present invention is preferable to have embodiment in which the scintillator panel is pressed and closely contacted to the flat light receiving element by an elastic member (such as sponge, spring). Further, preferred is an embodiment in which the scintillator panel is closely contacted to the flat light receiving element by reduced pressure between gap of the scintillator panel and the flat light receiving element and surrounding portion is sealed by a contact sealing member. The contact sealing member is preferable an ultraviolet curable resin.

Further, preferred is an embodiment in which the scintillator panel has a scintillator layer and the scintillator layer is closely contacted directly to the flat light receiving element.

The ultraviolet curable resin is not particularly limited and can be employed by selecting as appropriate from conventional used. The ultraviolet curable resin includes photopolymerizable prepolymer or photopolymerizable monomer with photopolymerization initiator or photosensitizer.

Specific examples of the photopolymerizable prepolymer include polyester acrylate based, epoxy acrylate based, urethane acrylate based or polyol acrylate based. These photopolymerizable prepolymer can be used in either alone or in combination of at least two thereof. Specific examples of the photopolymerizable monomer include polymethylolpropane tri(meth)acrylate, hexanediol(meth)acrylate, tripropyleneglycol di(meth)acrylate, diethyleneglycol di(meth)acrylate, pentaerythritol tri(meth)acrylate, dipentaerythritol hexa(meth)acrylate, 1,6-hexanediol di(meth)acrylate, and neopentylglycol di(meth)acrylate According to the present invention, preferred are urethane acrylate base as the prepolymer, and dipentaerythritol hexa (meth)acrylate as the photopolymerizable monomer.

Specific example of photo polymerization initiator includes acetophenones, benzophenones, α-amyloxime eaters, tetramethylthiuram monosulfides and thioxanthones. Specific example of photo sensitizer includes combination of n-butylamine, triethylamine and poly-n-butylphosphine.

Figure 2:
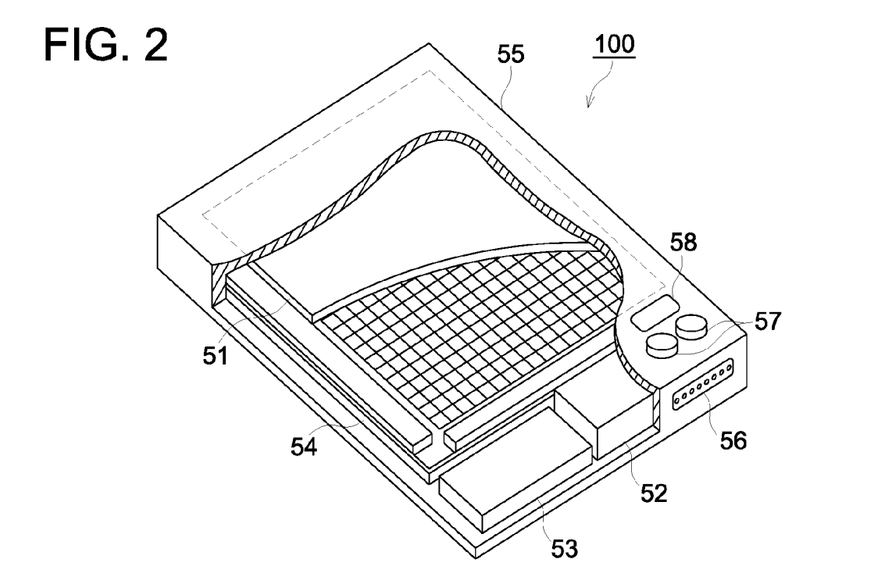
FIG. 2 is a schematic partial cutaway perspective view of the constitution of the radiation image detection device.
Figure 3:
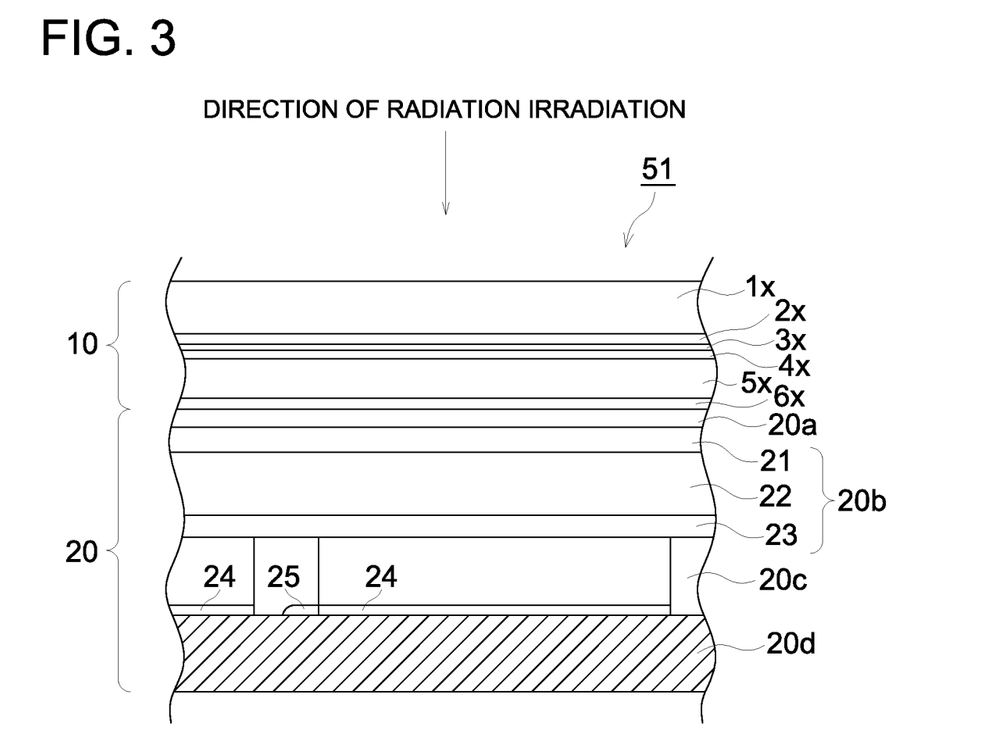
FIG. 3 shows an enlarged cross sectional view of the imaging panel.

The constitution of a radiation image detection device 100 having the scintillator panel 10 is described below referring FIGS. 2 and 3 as an application example of the scintillator panel 10. FIG. 2 is a partially broken oblique view showing the out line of the constitution of the radiation image detection device 100. FIG. 3 is an enlarged cross section of imaging panel 51.

As is shown in FIG. 2, the radiation image detection device 100 has a case 55 in which the imaging panel 51, a controlling means 52 for controlling the movement of the radiation image detection device 100, a memory means 53 as a means for memorizing image signals generation from the imaging panel 51 using a rewritable exclusive memory such as a flash memory and a power source 54 as an electric power supplying means for supplying electric power necessary for driving the imaging panel 51 to obtain the image signals are provided. On the case 55, a connector 56 for informing between the radiation image detection device 100 and the exterior, an operation means 57 for changing the action of the radiation image detection device 100 and a displaying means 58 for displaying the completion of imaging preparation and that of writing of designated amount of the image signals into the memory 53 are provided according to necessity.

The radiation image detection device 100 can be made portable by providing the power supplying means 54 and the memory 53 for memorizing the image signals of the radiation image to the radiation image detection device 100 and making the radiation image detection device 100 to be able to freely connecting and releasing through the connector 56.

As is shown in FIG. 3, the imaging panel 51 is constituted by the scintillator panel 10 and an output base board 20 for absorbing the magnetic wave from the scintillator panel 10 and generating the image signals.

The scintillator panel 10 is placed on the radiation incidental side and generates electromagnetic waves corresponding to the intensity of the incident radiation.

The output base board 20 is provided on the side opposite to the radiation incident face of the scintillator panel 10 and has a separation layer 20a, a photoelectric conversion element 20b, an image signal generation layer 20c and a basic board 20d in the order of from the scintillator panel side.

The separation layer 20a is a layer for separating the scintillator panel 10 from the other layers.

The photoelectric conversion element 20b is constituted by a transparent electrode 21, a charge generation layer 22 for generating charge when excited by electromagnetic waves permeated through the transparent electrode, and a counter electrode 23 for being the counter electrode to the transparent electrode 21, which are arranged in the order of the transparent electrode, the charge generation layer 22 and the counter electrode 23 from the side of the separation layer 20a.

The transparent electrode 21 is an electrode let passing electromagnetic waves to be subjected to photoelectric conversion, and is formed by an electroconductive transparent material such as indium tin oxide (ITO), $SnO_2$ and ZnO, for example.

The charge generation layer 22 is formed as a thin layer on one side of the transparent electrode 21, which contains an organic compound capable of conversing light to electric current by separating electric charge by light, and an electron donor capable of generating charge and an electroconductive compound as an electron acceptor. In the charge generation layer 22, the electron donor is exited and releases electrons when irradiated by the electromagnetic waves and the released electrons are transferred to the electron acceptor so that charge namely carriers of positive hole and electron are generated.

As the electroconductive compound for the electron donor, p-type electroconductive polymer compounds can be cited. As the p-type electroconductive polymer, ones having a basic skeleton of polyphenylenevinylene, polythiophene, poly(thiophene-vinylene), polyacetylene, polypyrrole, polyfluorene, poly(p-penylene) or polyaniline.

As the electroconductive compound for the electron acceptor, n-type electroconductive compounds can be cited. As the n-type electroconductive compound, ones having a basic skeleton of pyridine are preferable and ones having a basic skeleton of poly(p-pyridylvinylene) are particularly preferred.

The thickness of the charge generation layer 22 is preferably not less than 10 nm and particularly preferably not less than 100 nm for maintaining the light absorbing amount and preferably not more than 1 μm and particularly preferably not more than 300 nm from the viewpoint of that the electric resistivity does not become too high.

The counter electrode 23 is provided on the side of the charge generation layer opposite to the side to which the light is irradiated. The material of the counter 23 can be selected from a usual metal such as gold, silver, aluminum and chromium, and the materials used for the transparent electrode 21, and a metal, alloy electroconductive compound and a mixture of them having a low work function of not more than 4.5 eV is preferable for obtaining suitable property.

A buffer layer may be provided between the charge generation 22 and each of the electrodes (the transparent electrode 21 and the counter electrode 23) arranged on both sides of the charge generation layer 22. The buffer layer functions as a buffer zone for preventing reaction between the charge generation layer with the transparent electrode or the counter electrode. The buffer layer is formed by lithium fluoride and poly(3,4-ethylenedioxythiophene), poly(4-stylenesulfonate) or 2,9-dimethyl-4,7-diphenyl[1,10]-phenanthroline for example.

The image signal generation layer 20c accumulates the charge obtained by the photoelectric conversion 20b and generates signals according to the accumulates charge, which is constituted by a condenser 24 as the charge accumulation element for accumulating the charge of each pixels obtained by the photoelectric conversion element and a transistor 25 as an image signal generation element.

As the transistor 25, for example, a TFT (thin film transistor) is used. The TFT may be an inorganic type transistor usually used for liquid crystal displays or that using an organic semiconductor, and preferably a TFT formed on plastic film. As the TFT formed on the plastic film, ones of amorphous silicon type are known, and a TFT formed on a flexible plastic film by arranging micro CMOS (Nanoblocks) formed by silicon single crystal on an embossed plastic film which is manufactured by FSA (Fluidic Self Assembly) technology developed by Alien Technology Corp. may be applied. TFTs using organic semiconductor such as those described in Science, 283, 822 (1999), Phys. Lett. 771488 (1998) and Nature, 403, 521 (2000) may be also used.

As the transistor 25 to be used in the present invention, the TFT manufactured by the FSA technology and that using the organic semiconductor are preferable and the TFT using the organic semiconductor is particularly preferred. When the TFT is constituted by the organic semiconductor, any vacuum evaporation equipment to be used for manufacturing the TFT using silicon is not necessary and the TFT can be formed by applying printing technology and ink-jet technology. Therefore, the production cost can be lowered and the transistor can be formed on a plastic substrate having low resistivity against heat since processing temperature can be lowered.

A collector electrode, not shown in the drawing, is connected to the transistor 25, which accumulates the charge generated by the photoelectric conversion element 20b and functions as one electrode of the condenser 24. The charge generated by the photoelectric conversion element 20b is accumulated by the condenser and the accumulated charge is readout by driving the transistor 25. Namely, the signal of each of the pixels of the radiation image can be output by driving the transistor 25.

The base board 20d functions as the support of the imaging panel 51 and can be constituted by a material the same as that of the substrate 1.

The function of the radiation image detection device 100 is described below.

Incident radiation to the radiation image detection device 100 permeates in the direction of from the side of the scintillator panel 10 of the imaging panel 51 to the base board 20d.

The phosphor layer 2 in the scintillator panel 10 absorbs energy of the radiation and generates electromagnetic waves corresponding to the intensity of the radiation. Among the generated electromagnetic waves, the electromagnetic waves irradiated to the output base board 20 arrives to the charge generation layer 22 through the separation layer 20a and the transparent electrode 21 of the output board 20. The electromagnetic waves are absorbed by the charge generation layer 22 and pairs of positive hole and electron (charge separation state) are formed corresponding to the intensity of the electromagnetic waves.

After that, the generated positive holes and electrons are each transferred to different electrodes (the transparent electrode layer and electroconductive layer) by the interior electric field formed by bias voltage applied from the power source 54. As a result of that photocurrent is generated.

Then the positive holes transferred to the counter electrode are accumulated in the condenser 24 of the image signal generation layer 20c. The positive holes accumulated in the condenser 24 generates image signals when the transistor 25 connected to the condenser 24 is driven and the generated image signals are memorized by the memory means 53.

EXAMPLES

The present invention will now be specifically described with the reference to examples, however the present invention is not limited thereto.

Scintilator panel was prepared by using the apparatus shown in FIG. 1 according to the following method.

Comparative Example 1

Preparation of Scintilator Panel

Phosphor material 1 (CsI: 0.003Tl) and phosphor material 2 (CsI: 0.003Tl) were deposited on the one side of the support comprising polyimide resin sheet to form a phosphor layer by the vacuum evaporation. Namely, the support was attached on the support holder having the support rotation mechanism. Then, the above phosphor raw materials were charged in the vaporization source crucibles. Each vaporization source crucible (totally two vaporization source crucibles) was arranged on circle which has a center with axis perpendicular to support in the vicinity of bottom face. Herein, support and evaporation sources were arranged to form a gap of 400 mm, as well as axis perpendicular to support and evaporation sources were arranged to form a gap of 400 mm. After that, the air in the vacuum vessel was once evacuated and Ar gas was introduced to adjust the vacuum degree to 0.1 Pa, then the temperature of the substrate was held at 30° C. while rotating the substrate at a rate of 10 rpm. Then the phosphor material 1 was vapor deposited by heating the resistor heating crucible and the deposition was completed when the thickness of the phosphor layer came up to 30 μm to obtain a the phosphor layer. After increasing the temperature of the support (substrate) to 200° C., the phosphor material 2 was vapor deposited and the deposition was completed when the thickness of the phosphor layer came up to 450 μm. Consequently, the phosphor layer was put into the protective layer bag to obtain the scintillator panel having the structure of sealed phosphor layer.

Example 1

In the preparation of Comparable example 1, the scintillator panel was prepared by changing the phosphor material 1 to only CsI.

Example 2

In the preparation of Example 1, the scintillator panel was prepared except that the phosphor material 2 was divided equally in two vaporization source crucibles, arranged on the same circle and vapor deposited simultaneously.

Example 3

In the preparation of Example 1, the scintillator panel was prepared except that the phosphor material 1 was divided equally in two vaporization source crucibles and vapor deposited and the deposition was completed when the thickness of the phosphor layer came up to 30 μm. After increasing the temperature of the support (substrate) to 200° C., the phosphor material 2 was divided equally in 4 vaporization source crucibles, arranged on the same circle and vapor deposited simultaneously and the deposition was completed when the thickness of the phosphor layer came up to 450 μm. Consequently, the phosphor layer was put into the protective layer bag to obtain the scintillator panel having the structure of sealed phosphor layer.

Example 4

In the preparation of Example 3, the scintillator panel was prepared except that the phosphor material 2 was divided equally in 8 vaporization source crucibles and arranged on the same circle and vapor deposited simultaneously.

Example 5

In the preparation of Example 4, the scintillator panel was prepared except that the deposition of the phosphor material 1 was completed when the thickness of the phosphor layer came up to 100 μm and the deposition of the phosphor material 2 was completed when the thickness of the phosphor layer came up to 450 μm.

Example 6

In the preparation of Example 4, the scintillator panel was prepared except that the deposition of the phosphor material 1 was completed when the thickness of the phosphor layer came up to 200 μm and the deposition of the phosphor material 2 was completed when the thickness of the phosphor layer came up to 450 μm.

Example 13

In the preparation of Example 3, the scintillator panel was prepared except that the phosphor material 2 was divided equally in 16 vaporization source crucibles and arranged on the same circle and vapor deposited simultaneously.

Example 14

In the preparation of Example 3, the scintillator panel was prepared except that the phosphor material 2 was divided equally in 24 vaporization source crucibles and arranged on the same circle and vapor deposited simultaneously.

Example 15

In the preparation of Example 3, the scintillator panel was prepared except that the phosphor material 2 was divided equally in 32 vaporization source crucibles and arranged on the same circle and vapor deposited simultaneously.

Consequently, obtained scintillators were evaluated as follows:

<Coefficient of Variation of Activator Concentration>

Coefficient of variation in activator ingredient Tl concentration in a plane of the phosphor layer was calculated as follows: 0.2 g of phosphor was collected from any 30 points in obtained phosphor layer, and measured by ICP. Standard deviation was calculated from obtained 30 Tl concentrations. Coefficient of variation represented by Expression (2) below was calculated by dividing the relative standard deviation by an average of 30 activator concentrations.

Coefficient of variation=Relative standard deviation of activator ingredient Tl concentration in a plane of the phosphor layer/Average of activator concentrations

[Evaluation]

Prepared radiation image conversion panel was set on Pax-Scan2520 (FPD manufactured by Varian) and following evaluation was measured.

<Evaluation Method of Luminance>

The backside (the face on which the phosphor layer is not formed) of each sample was irradiated with an X-ray of tube voltage of 80 kVp and the image data were detected by a FPD and an average signal value of image was defined as the luminance of the emission. The values of luminance of each sample are the relative value based on the luminance of radiation image conversion panel Comparative example 1-1 being 100. The higher luminance value corresponds to superiority in the luminance and excellent.

Luminance of any 10 portion in a plane of the phosphor layer of prepared scintillator panel were measured, a distribution of luminance was calculated by using MAX and MN value according to the Expression below.

Distribution of luminance=(MAX−MIN)/(MAX+MIN)×2[%]

<Sharpness>
<Evaluation of Sharpness>

The incident side of FPD was irradiated with an X-ray of tube voltage of 80 kVp through a lead MTF chart and the image data were detected and recorded on a hard disc. And then the records on the hard disc were analyzed by computer and the modulation transfer function MET (at a spatial frequency of 1 cycle/mm) of the X-ray image recorded on the hard disc was determined as the indicator of the image sharpness. The values of MTF of each sample are the relative value based on the MTF of the Comparative example 1-1 being 100. The higher MTF value corresponds to superiority in the sharpness. MTF is an abbreviation of Modulation Transfer Function.

MTF of any 10 portion in a plane of the phosphor layer of prepared scintillator panels were measured, a distribution of MTF was calculated by using MAX and MN value according to the Expression below.

Distribution of MTF=(MAX−MIN)/(MAX+MIN)×2[%]

amples 1-6, 13-15) each of which has the coefficient of variation in activator ingredient Tl concentration in a plane of the phosphor layer lower than 40% are excellent in the distribution of the luminance and the sharpness.

On the contrary, the conventional scintillator panel (Comparative example 1) which has the coefficient of variation in activator ingredient Tl concentration in a plane of the phosphor layer higher than 40% are poor in the distribution of the luminance and the sharpness. Therefore, it is found that the coefficient of variation in activator ingredient Tl concentration in a plane of the phosphor layer is preferable lower than 40%, more preferable lower than 30%, still more preferable lower than 20%, particular preferable lower than 10%.

Comparative example 2

On a glass substrate, a plurality of photo diodes and a plurality of TFT elements were formed, followed by covering all thereof by a protective layer comprising epoxy resin. On the protective layer, a scintillator layer was formed as the same manner as Comparative example 1. Then, on the scintillator layer, a moisture-resistant protective layer comprising polyparaxylylene (20 μm), a reflective layer comprising aluminum (20 nm) and a protective layer comprising epoxy resin (100 μm) were laminated to obtain a radiation detection device.

Examples 7-12, 16-18

Radiation detection devices (Examples 7-12, 16-18) were prepared by replacing the scintillator layer of the radiation detection device (Comparative example 2) to the scintillator layers which were employed in Examples 1-6, 13-15.

Obtained radiation detection devices were evaluated as same as Comparative example 1.

Results are shown in Table 1.

As can clearly be seen from the results shown in Table 1, the distribution of the luminance and MTF improve in each of

TABLE 1

| | Phosphor material 1 | | Phosphor material 2 | | Length in a root part [%] | Coefficient of variation in Tl [%] | Uneveness of luminance [%] | Uneveness of MTF [%] |
| --- | --- | --- | --- | --- | --- | --- | --- | --- |
| | Composition | Numbers of vaporization source | Composition | Numbers of vaporization source | | | | |
| Comparative example 1 | CsI: 0.003Tl | 1 | CsI: 0.003Tl | 1 | 6.7% | 42 | 31 | 32 |
| Example 1 | CsI only | 1 | CsI: 0.003Tl | 1 | 6.7% | 38 | 21 | 24 |
| Example 2 | CsI only | 1 | CsI: 0.003Tl | 2 | 6.7% | 26 | 16 | 18 |
| Example 3 | CsI only | 2 | CsI: 0.003Tl | 4 | 6.7% | 17 | 10 | 13 |
| Example 4 | CsI only | 2 | CsI: 0.003Tl | 8 | 6.7% | 9 | 8 | 11 |
| Example 5 | CsI only | 2 | CsI: 0.003Tl | 8 | 22.2% | 19 | 13 | 15 |
| Example 6 | CsI only | 2 | CsI: 0.003Tl | 8 | 44.4% | 25 | 24 | 12 |
| Comparative example 2 | CsI: 0.003Tl | 1 | CsI: 0.003Tl | 1 | 6.7% | 43 | 32 | 32 |
| Example 7 | CsI only | 1 | CsI: 0.003Tl | 1 | 6.7% | 38 | 22 | 23 |
| Example 8 | CsI only | 1 | CsI: 0.003Tl | 2 | 6.7% | 27 | 16 | 16 |
| Example 9 | CsI only | 2 | CsI: 0.003Tl | 4 | 6.7% | 18 | 11 | 12 |
| Example 10 | CsI only | 2 | CsI: 0.003Tl | 8 | 6.7% | 9 | 9 | 9 |
| Example 11 | CsI only | 2 | CsI: 0.003Tl | 8 | 22.2% | 20 | 15 | 14 |
| Example 12 | CsI only | 2 | CsI: 0.003Tl | 8 | 44.4% | 27 | 25 | 12 |
| Example 13 | CsI only | 2 | CsI: 0.003Tl | 16 | 6.7% | 4 | 6 | 9 |
| Example 14 | CsI only | 2 | CsI: 0.003Tl | 24 | 6.7% | 2 | 4 | 7 |
| Example 15 | CsI only | 2 | CsI: 0.003Tl | 32 | 6.7% | 1 | 2 | 5 |
| Example 16 | CsI only | 2 | CsI: 0.003Tl | 16 | 6.7% | 4 | 7 | 7 |
| Example 17 | CsI only | 2 | CsI: 0.003Tl | 24 | 6.7% | 2 | 5 | 5 |
| Example 18 | CsI only | 2 | CsI: 0.003Tl | 32 | 6.7% | 1 | 3 | 4 |

As can clearly be seen from the results shown in Table 1, the scintillator panels according to the present invention (Examples 1-6, 13-15) the radiation detection devices having the scintillator panels according to the present invention (Examples 7-12, 16-18).

On the contrary, the radiation detection device having the conventional scintillator panel (Comparative example 2) which has the coefficient of variation in activator ingredient Tl concentration in a plane of the phosphor layer higher than 40% shows poor in the distribution of the luminance and MTF. Therefore, it is found that the coefficient of variation in activator ingredient Tl concentration in a plane of the phosphor layer is preferable lower than 40%, more preferable lower than 30%, still more preferable lower than 20%, particular preferable lower than 10%.

DESCRIPTION OF THE ALPHANUMERIC DESIGNATIONS

1 Production apparatus of scintillator panel
2 Vacuum vessel
3 Vacuum pump
4 Support
5 Support holder
6 Support rotation mechanism
7 Support rotation shaft
8 Evaporation source
9 Shutter
1$x$ Substrate
2$x$ Intermediate layer
3$x$ Reflective layer
4$x$ Protective layer
5$x$ Scintillator layer
6$x$ Moisture-resistant protective layer
51 Imaging panel
10 Radiation scintillator
100 Radiation image detection device

What is claimed is:

1. A scintillator panel comprising a support, and deposited thereon, a phosphor layer comprising a columnar phosphor crystal formed by a vapor deposition method,
wherein the columnar phosphor crystal comprise cesium iodide (CsI) as a base ingredient and thallium (Tl) as an activator ingredient, and a layer containing no thallium in a root part of the columnar phosphor crystal, and
a coefficient of variation in thallium concentration in a plane of the phosphor layer is 1 to 30%.

2. A method for manufacturing the scintillator panel of claim 1,
wherein the phosphor layer is formed by a vapor deposition method using a vapor deposition apparatus comprising an evaporation source and a rotation mechanism of a support in a vacuum vessel, and comprising steps of:
fixing the support to the rotation mechanism of a support, and
vapor-depositing a phosphor material while rotating the support.

3. The method for manufacturing the scintillator panel of claim 2,
wherein the phosphor layer is formed by a vapor deposition method comprising a plurality of evaporation sources in the vacuum vessel, and
comprising a step of vapor-depositing 2 or more kinds of the phosphor materials having different composition charged in the evaporation sources.

4. A radiation detector comprising the scintillator panel of claim 1 and a light receiving element in which a plurality of light receiving pixels are arranged in a two-dimensional array.

5. A radiation detector comprising a photoelectric conversion element formed on a substrate and a phosphor layer containing a columnar phosphor crystal formed by a vapor deposition method on the photoelectric conversion element,
wherein the columnar phosphor crystal comprise cesium iodide (CsI) as a base ingredient and thallium (Tl) as an activator ingredient, and a layer containing no thallium in a root part of the columnar phosphor crystal; and
a coefficient of variation in thallium concentration in a plane of the phosphor layer is 1 to 30%.

6. A method for manufacturing the radiation detector of claim 5,
wherein the phosphor layer is formed by a vapor deposition method using a vapor deposition apparatus comprising an evaporation source and a rotation mechanism of a support in a vacuum vessel, and comprising steps of:
fixing the substrate to the rotation mechanism of a substrate, and
vapor-depositing a phosphor material while rotating the substrate.

7. The method for manufacturing the radiation detector of claim 6,
wherein the phosphor layer is formed by a vapor deposition method comprising a plurality of evaporation sources in the vacuum vessel, and
comprising a step of vapor-depositing 2 or more phosphor materials having different composition charged in the evaporation sources.

* * * * *